United States Patent [19]

Gutermann et al.

[11] Patent Number: 4,530,818
[45] Date of Patent: Jul. 23, 1985

[54] TRANSPARENT FUSED SILICA BELL FOR PURPOSES RELATING TO SEMICONDUCTOR TECHNOLOGY

[75] Inventors: Alfons Gutermann, Freigericht; Heinz Herzog, Karlstein; Heinrich Mohn, Gelnhausen; Karl A. Schülke, Neuberg, all of Fed. Rep. of Germany

[73] Assignee: Heraeus Quarzschmelze GmbH, Hanau, Fed. Rep. of Germany

[21] Appl. No.: 345,513

[22] Filed: Feb. 4, 1982

Related U.S. Application Data

[63] Continuation of Ser. No. 123,323, Feb. 21, 1980, abandoned.

[30] Foreign Application Priority Data

Mar. 3, 1979 [DE] Fed. Rep. of Germany ....... 2908288

[51] Int. Cl.³ .............................................. C30B 25/08
[52] U.S. Cl. ................................... 422/240; 422/245; 118/715

[58] Field of Search ................ 156/610-614; 422/245, 240; 423/349; 148/175; 427/86, 95; 118/715, 716, 720, 726; 215/1 R; 65/42

[56] References Cited

U.S. PATENT DOCUMENTS

| | | | |
|---|---|---|---|
| 3,751,539 | 8/1973 | Reuschel et al. | 118/715 |
| 3,853,974 | 12/1974 | Reuschel et al. | 156/613 |
| 4,000,716 | 1/1977 | Kurata et al. | 156/613 |
| 4,019,645 | 4/1977 | Seiler et al. | 215/1 R |
| 4,173,944 | 11/1979 | Köppl et al. | 427/86 |

FOREIGN PATENT DOCUMENTS

| | | | |
|---|---|---|---|
| 263082 | 7/1968 | Austria | 156/613 |
| 259593 | 6/1968 | U.S.S.R. | 118/715 |

Primary Examiner—Hiram H. Bernstein
Attorney, Agent, or Firm—Sprung Horn Kramer & Woods

[57] ABSTRACT

An epitaxy bell of transparent fused silica is provided with a flanged, thick-walled tubular piece of transparent fused silica on the side on which a process gas is exhausted. The wall thickness of the constricted portion of the bell is increased toward the transparent fused silica tubular piece.

3 Claims, 1 Drawing Figure

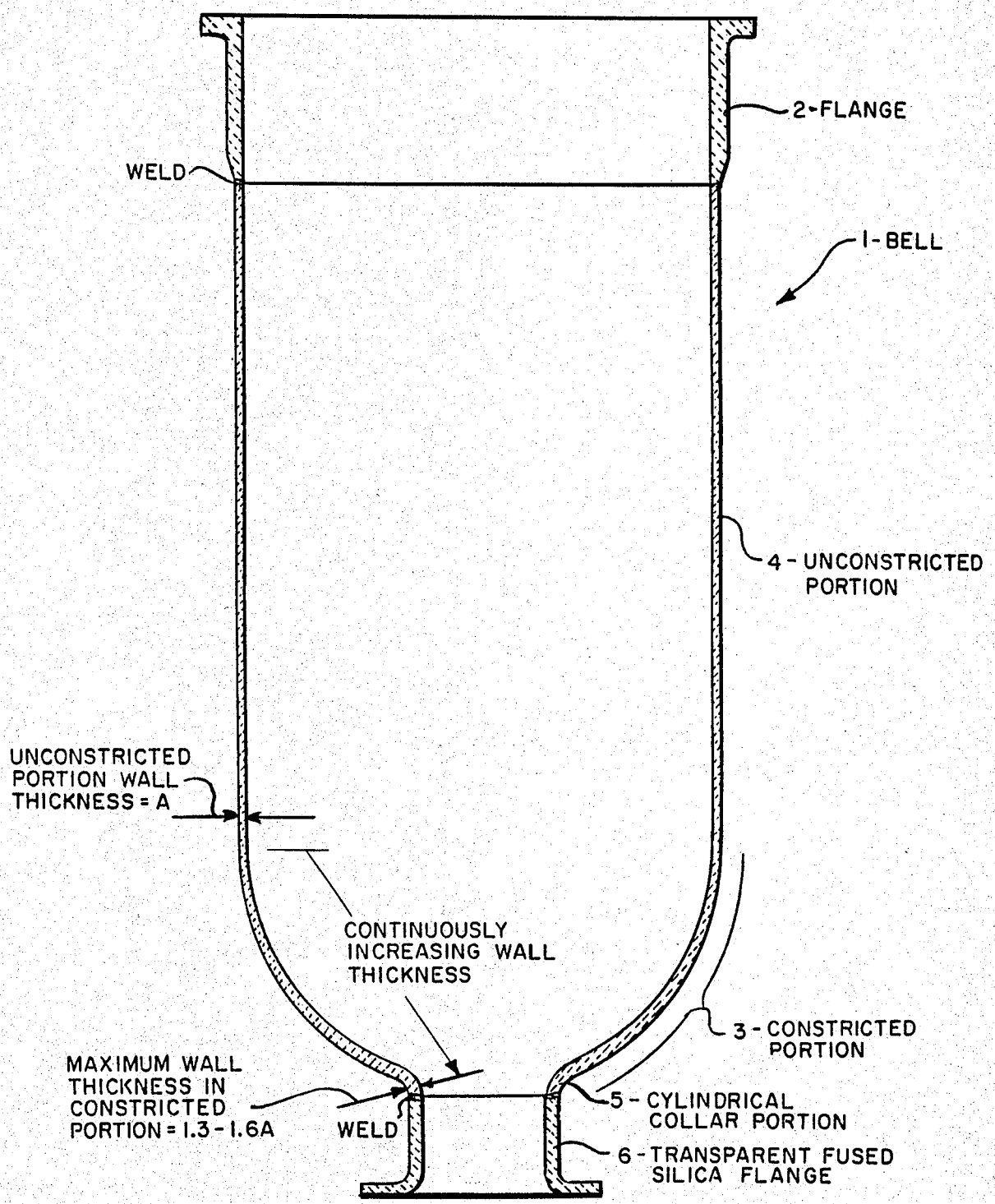

TRANSPARENT FUSED SILICA BELL FOR PURPOSES RELATING TO SEMICONDUCTOR TECHNOLOGY

This is a continuation, of application Ser. No. 123,323, now abandoned filed Feb. 21, 1980.

BACKGROUND OF THE INVENTION

1. Field of the Invention

The invention relates to a bell of transparent vitreous silica for purposes relating to semiconductor technology, particularly to an epitaxy bell, having a flange consisting of fused silica material and welded to the constricted end from which a process gas is exhausted during operation, and having a flange of opaque fused silica welded to the opposite end at which the process gas enters.

2. Discussion of Prior Art

Bells of the kind described above are known and are used for growing monocrystalline silicon on silicon semiconductor chips. The bells are usually operated in the vertical position. In the known bells, the welded flange consists of a cylindrical opaque fused silica body having marginal fins made by sawing. An annular transparent fused silica plate is welded onto this opaque fused silica body. For the support of this flange of such very complex construction, the transparent fused silica plate is welded at its outside margin to a hollow cylinder of transparent fused silica, whose other end is welded to the tapered bell portion.

The known bells of transparent fused silica have proven effective in operation, but on account of the complex construction of the flange they are made at the cost of a large amount of labor, so that they are rather expensive and also easily broken.

THE INVENTION

It is the object of the invention to provide a fused silica bell for purposes relating to semiconductor technology in which the flange welded to the constricted end is less subject to trouble and can be made at lower cost.

This object is achieved in accordance with the invention in a bell of the kind described above, in that the flange at the process gas exhaust end consists of a flanged, thick-walled tubular piece of transparent fused silica, one end of it being welded onto the constricted portion of the bell whose wall thickness is increased in the constricted portion, amounting to no more than twice the wall thickness of the bell in the unconstricted portion.

Bells in which the wall thickness in the constricted portion increases continuously have proven practical. The wall thickness of the bell in the constricted portion advantageously amounts to no more than 1.3 to 1.6 times the bell wall thickness in the unconstricted portion. The constricted portion of the bell is adjoined on the welded flange side by a cylindrical collar portion which is welded, for example, to the constricted end of the bell. The flange is welded to this collar position.

By constructing the constricted portion of the bell and the welded flange in accordance with the invention, a high, uniform strength is assured. The amount of work involved in constructing the bell end in accordance with the invention is considerably less than that involved in the known bell flange. Furthermore, by constructing the flange in the manner of the invention, the advantage is additionally obtained that it is possible when the bells are installed to observe through the transparent flange of the tubular piece whether the resilient annular gaskets applied to this flange are still in condition for safe operation.

The bells of this invention are useful in epitaxial processes wherein a processing gas is introduced into an open end of said bell and removed at an opposed end of the bell which is constricted. Epitaxial processes for which the bell can be used include those of the semiconductor technology wherein epitaxial growth is to be effected by introduction into the bell of a process gas, the bell containing a substrate onto which a component derived from the process gas is to be grown. These processes include chemical vapor deposition for homoepitaxial growth of single-crystal magnesium oxide on a substrate of magnesium oxide. Other processes include single crystal silicon deposition upon an insulating surface, e.g. sapphire. The deposited silicon is greater than three quarters of an inch in diameter and is of the quality required for diodes and transistors. The bells can also be used for chemical vapor deposition of single crystal germanium on gallium arsenide and for single crystal magnetic oxide film formation, among others. These processes essentially involve desposition of a material from the process gas onto a substrate within the bell. Excess gas is exhausted from the bell. Exceptionally high temperature can prevail in the constricted end of the bell.

BRIEF DESCRIPTION OF THE DRAWING

Referring to the annexed drawing, the same is a magnified side elevation of an epitaxial bell according to the invention.

DESCRIPTION OF SPECIFIC EMBODIMENT

The bell is identified by the general reference number 1. A flange 2 of opaque fused silica is welded to the end of the bell through which the process gas enters. The opposite end 3 of the bell 1, through which the process gas is exhausted, is of constricted configuration. The wall thickness of the constricted portion of the bell increases progressively in this embodiment. It amounts to no more than twice the bell wall thickness in the unconstricted portion 4. The tapered portion 3 of the bell is adjoined by a cylindrical collar portion 5 to which there is welded the flanged, thick-walled tubular piece 6 of transparent fused silica.

What is claimed is:

1. A bell of transparent fused silica for purposes relating to semi-conductor technology, especially an epitaxy bell, consisting essentially of a bell wall, said bell wall having an unconstricted portion and a constricted end portion, said constricted end portion welded to a flange of transparent fused silica, said flange consisting essentially of a thick walled tubular piece of transparent fused silica, one end of which is welded to said constricted end portion, said constricted end portion having a thickness greater than the thickness of the unconstricted portion of said bell wall but no more than twice the thickness of the unconstricted portion, the wall thickness of said constricted end portion continuously increasing towards said thick walled tubular piece, said bell having means for maintaining a process gas flow through said bell from said unconstricted portion out via said constricted end portion of said flange consisting essentially of said thick walled tubular piece of transparent fused silica.

2. A bell of claim 1, wherein the wall thickness of the bell in the constricted portion amounts to no more than 1.3 to 1.6 times the bell wall thickness in the unconstricted portion.

3. A bell of claim 1, wherein a cylindrical collar portion is situated between the constricted end portion and the welded transparent fused silica flange.

* * * * *

UNITED STATES PATENT AND TRADEMARK OFFICE
CERTIFICATE OF CORRECTION

PATENT NO. : 4,530,818
DATED : July 23, 1985
INVENTOR(S) : Alfons Gutermann, et al It is certified that error appears in the above-identified patent and that said Letters Patent is hereby corrected as shown below:

Col. 3, lines 1, 2          Delete "the bell in"

Signed and Sealed this

Twenty-sixth Day of November 1985

[SEAL]

Attest:

Attesting Officer

DONALD J. QUIGG

Commissioner of Patents and Trademarks